United States Patent [19]

Gibson et al.

[11] Patent Number: 5,753,379
[45] Date of Patent: May 19, 1998

[54] PROTECTIVE COATINGS FOR OPTICAL COMPONENTS

[75] Inventors: Desmond Robert Gibson, Glasgow; Keith Loder Lewis, Malvern; Ewan MacKinnon Waddell, Fintry, all of United Kingdom

[73] Assignees: Barr & Stroud Limited, Glasgow; The Secretary of State for Defence in Her Britannic Majesty's Government of the United Kingdom of Great Britain and Northern Ireland, London, both of United Kingdom

[21] Appl. No.: 503,266

[22] Filed: Jul. 17, 1995

[30] Foreign Application Priority Data

Jul. 23, 1994 [GB] United Kingdom ............. 9414905

[51] Int. Cl.$^6$ ............................................. B32B 9/00
[52] U.S. Cl. ................... 428/699; 428/408; 428/432; 428/689; 428/704
[58] Field of Search ......................... 428/699, 408, 428/704, 432; 427/535, 576, 585, 590

[56] References Cited

U.S. PATENT DOCUMENTS

| 5,169,452 | 12/1992 | Nakayama et al. | 118/723 |
| 5,273,587 | 12/1993 | Guha et al. | 118/723 |

FOREIGN PATENT DOCUMENTS

| 0463812A2 | 6/1991 | European Pat. Off. |
| 0 463 812 | 1/1992 | European Pat. Off. |
| 2 223 510 | 4/1990 | United Kingdom |
| 2244285 | 5/1991 | United Kingdom |

OTHER PUBLICATIONS

Optical Engineering, vol. 33, No. 3, Mar. 1, 1994, pp. 957–966, Gibson et al., "Ultradurable phosphide–based anti-reflection coatings for sand and rain erosion protection".

Journal of Vacuum Science and Technology, Part B, vol. 10, No. 3, May 1, 1992, pp. 1070–1073, "Remote Plasma Enhanced Chemical Vapor Deposition Of Gap With in Situ Generation Of Phosphine Precursors".

Hard Materials In Optics, The Hague, NL, Mar. 14–15, 1990, vol. 1275, Mar. 14, 1990, Carl G. Ribbing, pp. 46–51, Lewis et al. "Phosphide Based Materials As Hard Optical Coatings — A Review".

*Primary Examiner*—Timothy Speer
*Attorney, Agent, or Firm*—Bell Seltzer Park

[57] ABSTRACT

An optical component having a protective layer provided on a surface thereof, the protective layer preventing the component from being damaged by high velocity impacts from small particles or water droplets. The protective coating comprises a layer of gallium phosphide deposited onto the component surface using plasma assisted chemical vapour deposition (PACVD), an intermediate layer of PACVD boron phosphide, and an outer layer of PACVD diamond-like-carbon.

10 Claims, 5 Drawing Sheets

PROTECTIVE COATINGS FOR OPTICAL COMPONENTS

The present invention relates to a method for providing protective coatings for infra-red transmitting optical components and to optical components so protected. The invention is applicable in particular, though not necessarily, to infra-red transmitting windows.

In many applications it is necessary to locate sensitive infra-red (IR) optical components, for example sources and detectors, behind infra-red transmitting windows in order to prevent the components being damaged by particles present in the surrounding atmosphere. The need for such protection is of particular importance when the IR-optical components are mounted on a device intended to travel at high velocity, for example airborne platforms such as aeroplanes and missiles, where the damage caused by dust particles and water droplets can be severe.

GB 2,223,510B describes a protective coating for an infra-red transmissive window comprising a thin layer of boron phosphide (BP). Such coatings reduce the damage caused to the window by both solid particle and water droplet impacts. EP-A2-0463812 discloses a protective window comprising a transparent substrate layer having a protective coating of polycrystalline gallium phosphide (GaP) deposited thereon by a conventional thermal chemical vapour deposition process. It is desirable to use GaP coatings in preference to BP coatings because of the reduced absorption of the former over certain regions of the IR spectrum (by as much as a factor of 20) enabling thicker coatings to be provided.

It is an object of the present invention to provide a gallium phosphide protective coating offering improved protection against solid particle and water droplet impacts.

According to a first aspect of the present invention there is provided a method of providing a protective coating on an optical substrate, the method comprising depositing on a surface of the substrate a layer of gallium phosphide using a plasma assisted chemical vapour deposition process, wherein the gallium phosphide layer is substantially transparent over a range of wavelengths in the electro-magnetic spectrum.

Preferably, the vapour deposition process is carried out using a deposition gas mixture comprising an organometallic gas, e.g tri-methyl-gallium, and phosphine.

Preferably the vapour deposition process is carried out using a deposition gas mixture comprising an inert gas or gas mixture. Preferably the inert gas or gas mixture comprises 50 to 70% of the deposition gas mixture. Preferably, the inert gas or gas mixture comprises argon although it may comprise helium or neon or a mixture of helium and neon. This introduction of inert gas into the chamber assists in decreasing the surface roughness of the protective coating and thereby enhances the durability and optical quality of the coating. The thickness of the coating may be in the range 5 to 40 μm although any thickness appropriate to the end use can be deposited.

In an embodiment of the invention a multi-layer phosphide based coating can be produced. In one example a layer of boron phosphide is deposited onto the optical substrate, in addition to the layer of gallium phosphide, using a plasma assisted chemical vapour deposition process. The boron phosphide layer is typically 2 μm thick. In addition to improving the mechanical properties of the coating, the optical properties of the boron phosphide layer may be engineered to provide a level of screening from electromagnetic interference for components to be arranged on or behind the optical component. Preferably, the boron phosphide layer is deposited on top of the gallium phosphide layer and a layer of diamond-like-carbon (DLC) is subsequently deposited on top of the boron phosphide layer.

Preferably, the protective coating is substantially transparent to infra-red radiation.

The substrate bias levels in the deposition process may be controlled in order to control the level of carbon incorporation into the deposited film. Suitable DC bias levels are in the range 50 to 150 V.

According to a second aspect of the present invention there is provided an optical component having a protective coating on at least one surface thereof, the protective coating being substantially transparent over a range of wavelengths in the electromagnetic spectrum, wherein the protective coating comprises a layer of amorphous gallium phosphide containing a level of carbon incorporation.

The level of carbon incorporation in the protective coating may be in the range 0.1% to 40%, more preferably 1% to 20%.

Preferably, the optical component comprises a layer of boron phosphide which may have a thickness of typically 2 μm. Preferably, the layer of boron phosphide is located on top of the layer of gallium phosphide.

Preferably the optical component comprises an outer layer of diamond-like-carbon (DLC). A typical DLC layer may be approximately 1.0 μm thick.

The optical component may comprise, for example, a germanium, zinc sulphide, zinc selenide or Tuftran™ substrate.

BRIEF DESCRIPTION OF THE DRAWINGS

For a better understanding of the present invention and in order to show how the same may be carried into effect reference will now be made, by way of example, to the accompanying drawings, in which.

The optical transmission properties of gallium phosphide (GaP) make it desirable as a protective coating for optical components in preference to boron phosphide (BP). In particular, amorphous GaP coatings, as opposed to crystalline or polycrystalline GaP coatings, have very good damage resistance properties in addition to high optical transmission levels.

Figure 1:
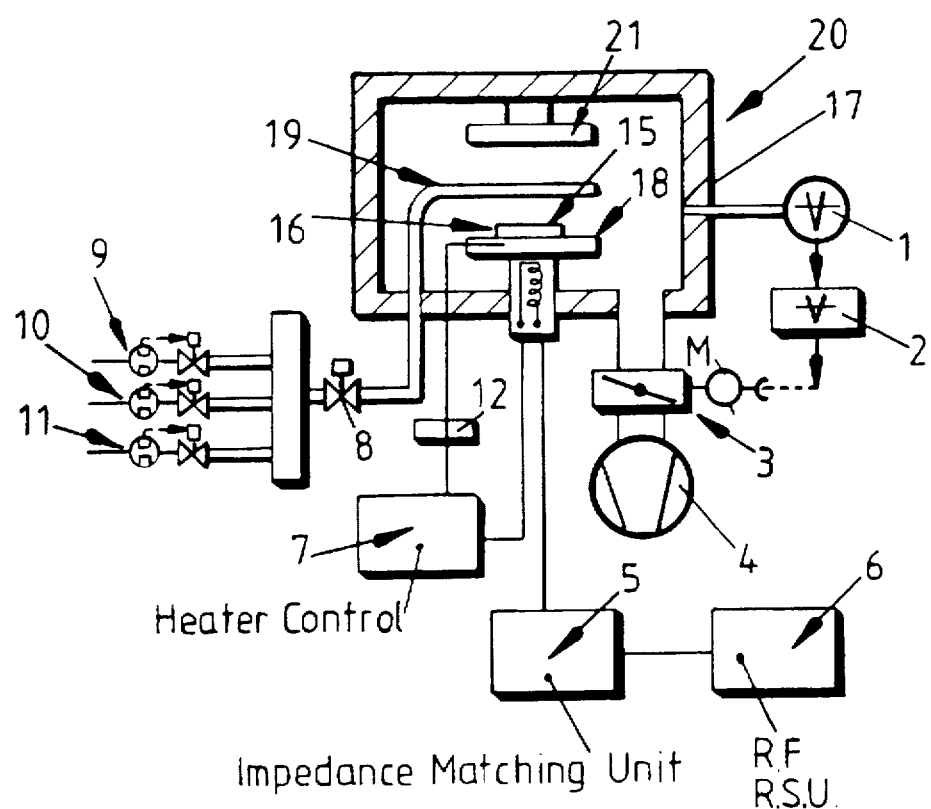
FIG. 1 schematically illustrates apparatus for depositing gallium phosphide coatings.

Apparatus suitable for depositing an amorphous GaP protective coating onto an optical component or substrate is illustrated in FIG. 1. This apparatus is similar to that described in GB 2,223,510B for depositing BP coatings. The apparatus comprises a deposition chamber 17 housing a cathode 18, a gas inlet 19 for supplying gases to the chamber and a gas outlet via valve 3 for exhausting gases from the chamber. The cathode is connected to an R.F. power supply 6.

Prior to commencing deposition the substrate 16 is heated by heater control unit 7 to an elevated temperature, typically 300° to 500° C. Immediately prior to the coating being deposited, the upper surface 15 of the substrate 16 is cleaned by sputtering with argon supplied to the chamber via mass flow controller (MFC) 9. Following the sputter clean, the pressure in the chamber is adjusted to a particular value, typically 0.05 to 0.5 torr, and is maintained at this value automatically by valve 3, manometer 1 and controller 2.

A suitable organo-metallic gas, in this case trimethyl-gallium (TMG), is then introduced into the chamber via MFC 10 at a flow rate of typically 10 to 15 SCCM and similarly phosphine ($PH_3$) is introduced via MFC 11 typically at a flow rate of 25 to 40 SCCM. Argon (or another suitable inert gas, e.g. helium or neon) is also introduced into the chamber via MFC 9 at a flow rate of typically 30 to 70 SCCM. RF power, typically 30 to 60 watts, is supplied to the substrate carrying electrode (cathode 18) via an auto-tuning (i.e. impedance matching) unit 5 and a plasma is generated in the space between the two electrodes 20, 21. As a result, a coating of GaP is deposited on the surface 15 of the substrate 16. Deposition continues for a chosen time depending on the thickness required. Typically a thickness of 15 μm is desirable requiring a deposition time of 10 hours, although useable coatings of several hundred microns have been achieved.

The purpose of introducing an inert gas into the chamber during deposition is to reduce the growth of nodules on the deposition surface, i.e. to improve the perfection of the deposited coating. In the absence of argon, nodule growth can be significant and can seriously reduce the optical properties and durability of the GaP coating. It is also believed that the presence of an inert gas causes energy exchange processes to occur in the plasma which in turn encourage densification of the deposited coating and improve adhesion.

Figure 2:
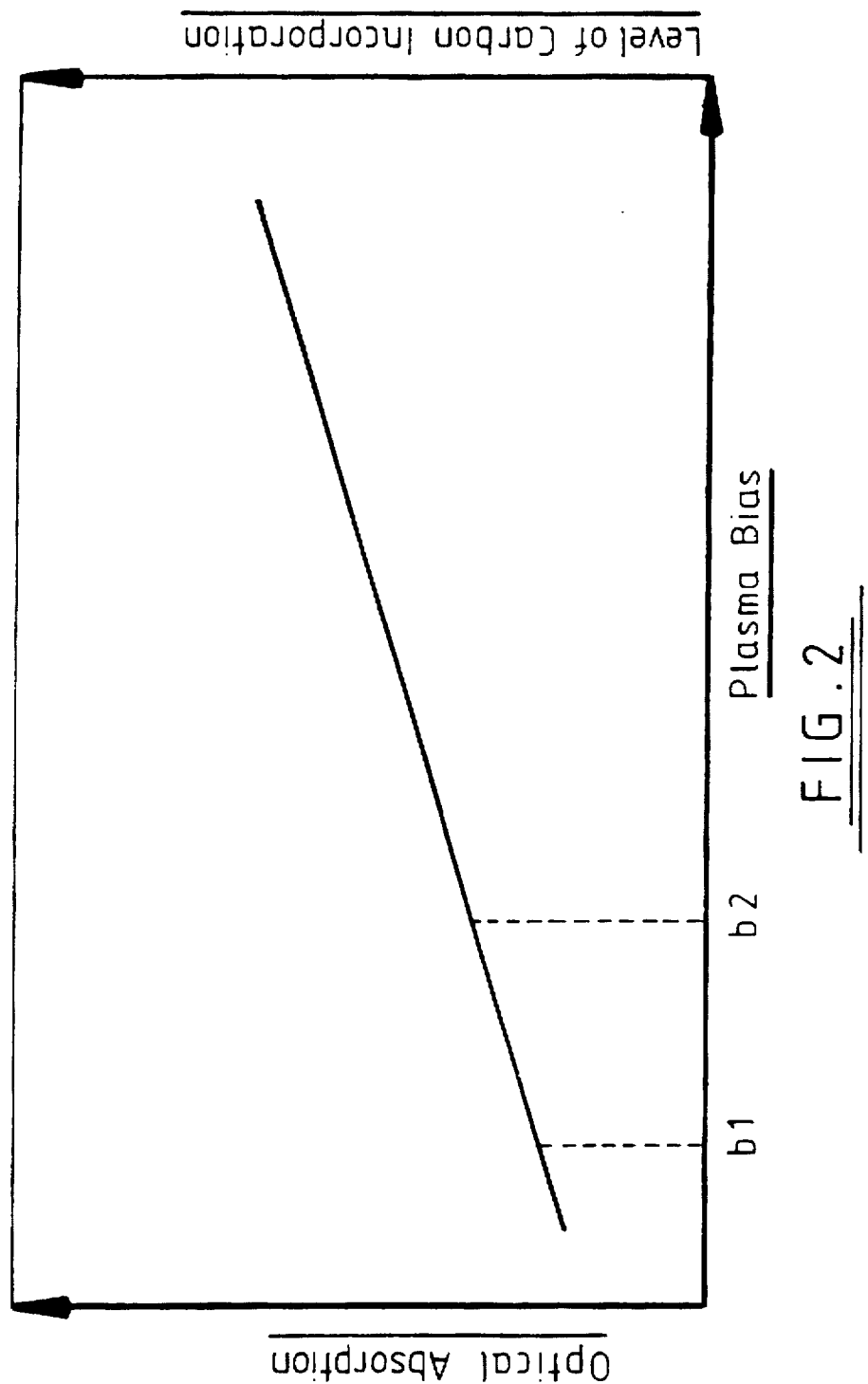
FIG. 2 shows the relationship between plasma bias and the level of carbon incorporation into a deposited coating.

In selecting an appropriate DC bias voltage for the deposition process it is necessary to consider the extent to which carbon is incorporated into the GaP layer during the deposition process. Above a threshold level of incorporation, carbon can lead to a significant deterioration of the optical transmissibility of the GaP layer. Carbon incorporation tends to increase as the plasma bias voltage increases and it is therefore necessary to maintain the bias voltage below an appropriate level (b2). This is shown in FIG. 2. However, too low a bias voltage (less than b1) results in degradation of the coating to an unacceptable level. The bias voltage is therefore maintained at a level between the threshold levels b1 and b2 (typically between 50 and 150 V).

Figure 3:
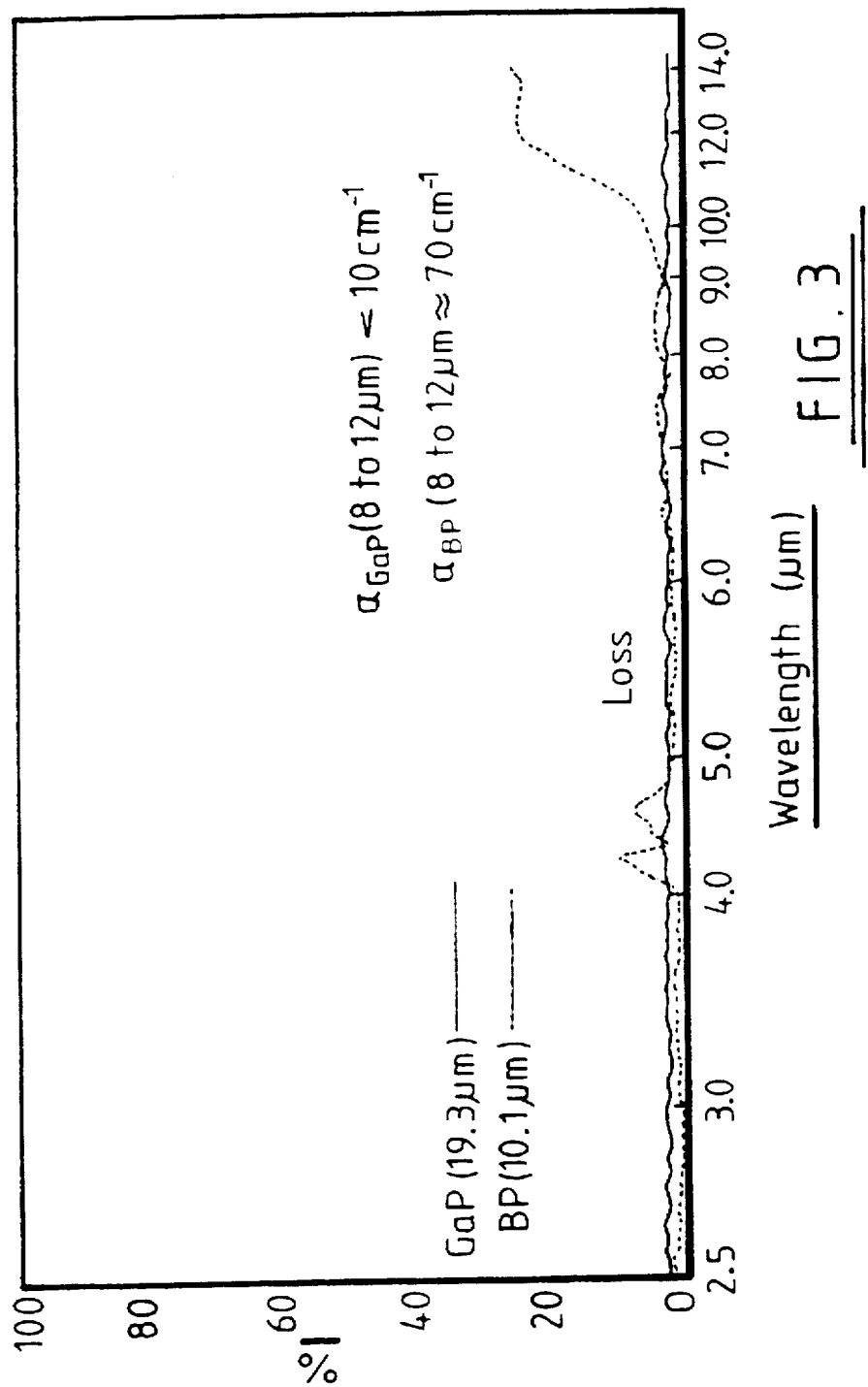
FIG. 3 shows optical loss spectra for BP and amorphous GaP over a range of IR wavelengths.

FIG. 3 compares the optical loss spectra for a conventional BP coating (10.1 μm thick) and an amorphous GaP coating (19.3 μm thick), deposited using the above process, from which it can be seen that the absorption peaks which exist for the BP coating do not exist for the GaP coatings.

Following deposition of the GaP layer, a thin layer of diamond-like-carbon (DLC) may be deposited over the GaP layer in a known manner. The DLC layer (typically 1.1 μm thick) provides an anti-reflection coating having additional protective qualities.

Figure 4:
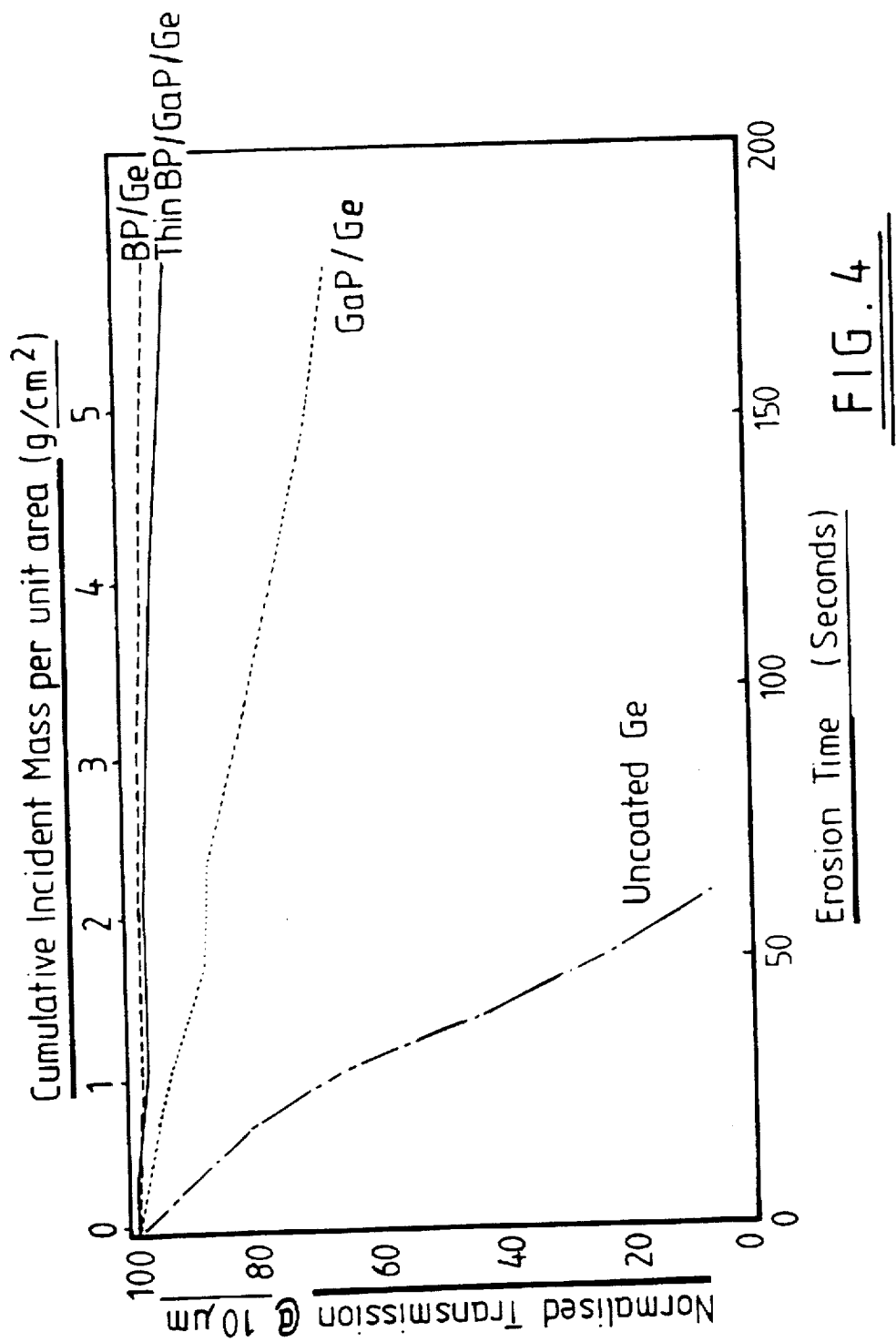
FIG. 4 shows the results of a "whirling arm" test for an uncoated germanium substrate and for germanium substrates with various protective coatings.
Figure 5:
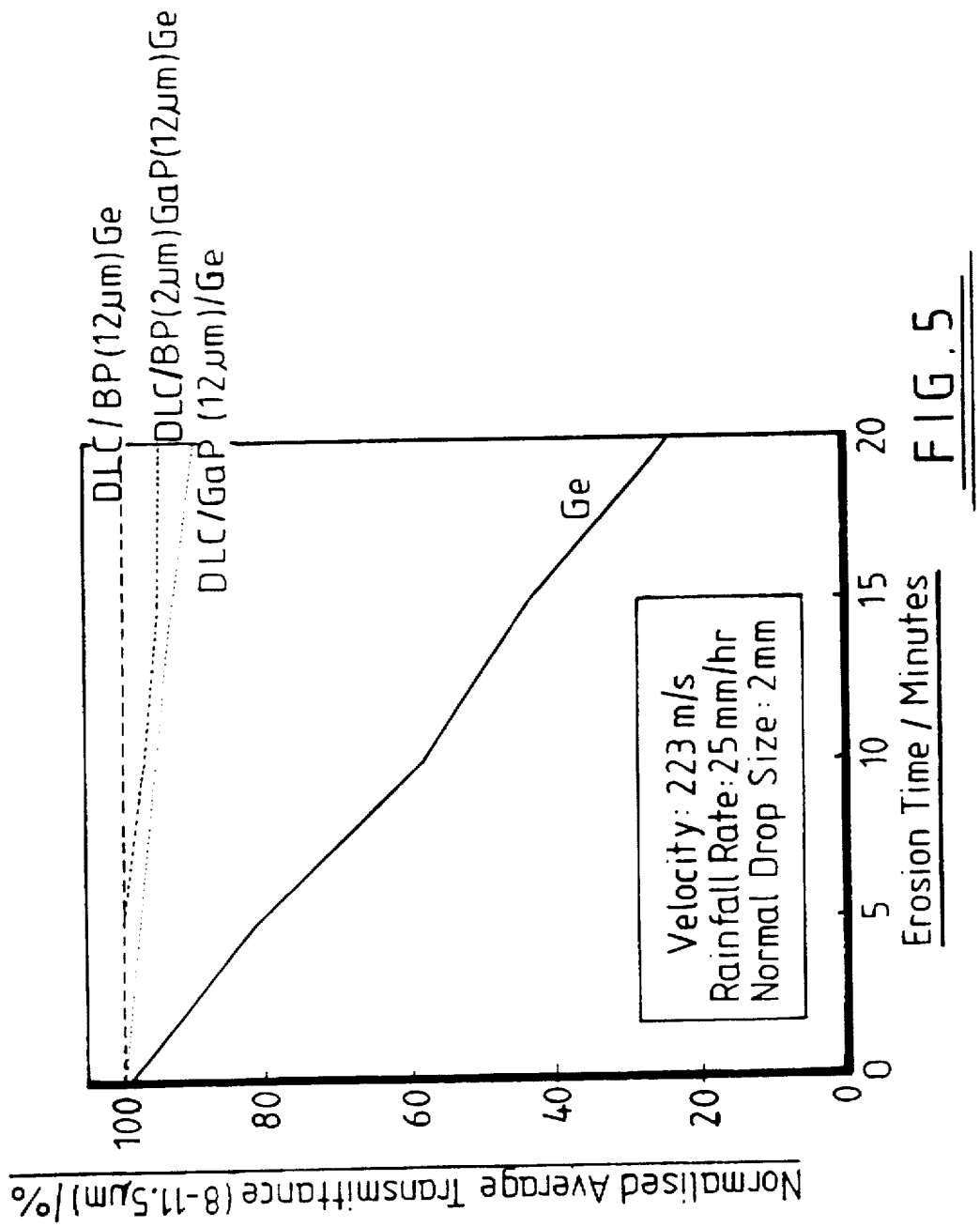
FIG. 5 shows the results of simulated sand erosion tests for germanium coated with a variety of coatings.

FIGS. 4 and 5 show the results of a 'whirling arm' test (in which samples are rotated in an atmosphere containing water droplets) and a solid particle impact test respectively for germanium substrates having no coating, a BP (12 μm) coating, and a GaP (12 μm) coating (the BP coating being covered by an additional thin layer of DLC). Both Figures show the reduction in optical transmission of the samples with test time.

It will be apparent that the ability of the GaP coating to withstand water droplet impacts is similar to that of DLC/BP whilst GaP affords somewhat less protection against solid particle impacts. These properties of GaP coatings are satisfactory for some purposes given the superior transmission properties of GaP.

FIGS. 3 and 4 also show results obtained with a protective coating comprising in sequence a layer of GaP (12 μm) on top of the Ge substrate, a relatively thin layer of BP (2 μm), and a layer of DLC (1.1 μm). The thin BP layer provides protection for the GaP layer such that the composite coating provides both solid particle and water droplet impact protection at a level only marginally below that of a thick BP coating (with DLC overcoat).

In order to produce a DLC/BP/GaP composite structure a thin layer of boron phosphide (BP), typically ≦2 μm, is deposited over the top of the GaP layer, prior to deposition of the DLC layer, using a similar plasma assisted chemical vapour deposition process of the type described in GB 2,223,510B. The equipment used is the same as that described above with reference to FIG. 1 and the BP layer may be deposited immediately following deposition of the GaP layer, e.g. by switching in diborane via one of the feed lines 9, 10, 11.

In addition to improving solid particle impact protection, the thin intermediate layer of BP may provide a significant degree of electrical screening from electro-magnetic interference for components being protected by the infra-red transmitting window. By increasing the boron content of the BP layer, e.g. by increasing the deposition temperature, the layer can be made more metallic, i.e. conductive, and the degree of screening improved.

A preferred use of the present invention is in the provision of protective coatings for transparent windows used to protect sensitive optical and electronic components, which windows allow radiation, and in particular infra-red radiation, to pass therethrough. Such windows are often found in airborne platforms, e.g. aircraft and missiles.

It will be apparent to the skilled person that various modifications may be made to the above described embodiments without departing from the scope of the invention. For example, the parameters selected for the deposition processes, e.g. d.c. bias, RF power, may be varied to optimise the qualities of the protective coating.

We claim:

1. An optical component having a protective coating on at least one surface thereof, the protective coating being substantially transparent over a range of wavelengths in the electromagnetic spectrum and comprising a layer of amorphous gallium phosphide containing a level of carbon incorporation in the range 0.1% to 40% and deposited by plasma assisted chemical vapor deposition in the presence of an inert gas which decreases the surface roughness of the layer.

2. An optical component according to claim 1, wherein the level of carbon incorporation is in the range 1% to 20%.

3. An optical component according to claim 1 and comprising a layer of boron phosphide deposited on top of the layer of amorphous gallium phosphide.

4. An optical component according to claim 3 and comprising a layer of diamond-like-carbon deposited on top of the layer of boron phosphide.

5. A method of providing a protective coating on an optical substrate, the method comprising depositing on a surface of the substrate a layer of amorphous gallium phosphide containing a level of carbon incorporation using a plasma assisted chemical vapor deposition process, wherein the vapor deposition process uses a deposition gas mixture providing the gallium, phosphide and carbon components for the layer, the gas mixture additionally comprising an inert gas to decrease the surface roughness of the amorphous layer and to enhance its optical and durability qualities and during the deposition process the substrate is held at a controlled DC bias level to control the level of carbon incorporation in the layer to be in the range 0.1% to 40%, as a result of which the deposited layer is amorphous, substantially transparent over a range of wavelengths in the electro-magnetic spectrum, and exhibits good damage resistance properties.

6. A method according to claim 5, wherein the inert gas comprises 50% to 70% of the deposition gas mixture.

7. A method according to claim 5 wherein the inert gas is at least one of argon, helium and neon.

8. A method according to claim 5, wherein the gallium and carbon components for the layer are provided by an organometallic gas and the DC bias level of the substrate is controlled during the deposition process to control the level of carbon incorporation in the layer to be in the range 1% to 20%.

9. A method according to claim 5 and comprising depositing a layer of boron phosphide on top of the layer of amorphous gallium phosphide, using a plasma assisted chemical vapor deposition process.

10. A method according to claim 9 and comprising depositing a layer of diamond-like carbon on top of the layer of boron phosphide.

* * * * *